(12) United States Patent
Wensel

(10) Patent No.: US 6,524,960 B2
(45) Date of Patent: Feb. 25, 2003

(54) USE OF RESIDUAL ORGANIC COMPOUNDS TO FACILITATE GATE BREAK ON A CARRIER SUBSTRATE FOR A SEMICONDUCTOR DEVICE

(75) Inventor: Richard W. Wensel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/886,782

(22) Filed: Jun. 21, 2001

(65) Prior Publication Data

US 2001/0039120 A1 Nov. 8, 2001

Related U.S. Application Data

(62) Division of application No. 09/574,471, filed on May 19, 2000, which is a division of application No. 09/019,209, filed on Feb. 5, 1998, now Pat. No. 6,117,708.

(51) Int. Cl.$^7$ .............................................. H04L 21/461
(52) U.S. Cl. ....................... 438/690; 438/118; 438/124; 438/126; 438/127
(58) Field of Search ................................ 438/118, 124, 438/126, 127, 690

(56) References Cited

U.S. PATENT DOCUMENTS

| | | |
|---|---|---|
| 4,460,537 A | 7/1984 | Heinle |
| 4,615,857 A | 10/1986 | Baird |
| 4,910,581 A | 3/1990 | Baird |
| 5,417,826 A | 5/1995 | Blalock |
| 5,434,750 A | 7/1995 | Rostoker et al. |
| 5,542,171 A | 8/1996 | Juskey et al. |
| 5,557,150 A | 9/1996 | Variot et al. |
| 5,635,671 A | 6/1997 | Freyman et al. |
| 5,656,549 A | 8/1997 | Woosley et al. |
| 5,780,933 A | 7/1998 | Ohmori et al. |
| 5,953,594 A | 9/1999 | Bhatt et al. |
| 5,963,792 A | 10/1999 | Wensel |
| 5,969,427 A | 10/1999 | Wensel |
| 5,981,873 A | 11/1999 | Heo |
| 6,072,236 A | 6/2000 | Akram et al. |
| 6,083,775 A | 7/2000 | Huang et al. |
| 6,316,290 B1 * | 7/2000 | Wensel ........................ 438/118 |
| 6,117,708 A | 9/2000 | Wensel |

* cited by examiner

Primary Examiner—David Nelms
Assistant Examiner—Reneé R. Berry
(74) Attorney, Agent, or Firm—TraskBritt

(57) ABSTRACT

An encapsulant molding technique used in chip-on-board encapsulation wherein a residual organic compound layer on the surface of a substrate is used to facilitate removal of unwanted encapsulant material. An organic compound layer which inherently forms on the substrate during the fabrication of the substrate or during various chip attachment processes is masked in a predetermined location with a mask. The substrate is then cleaned to remove the organic compound layer. The mask protects the masked portion of the organic material layer which becomes a release layer to facilitate gate break. An encapsulant mold is placed over the substrate and chip and an encapsulant material is injected into the encapsulant mold cavity through an interconnection channel. The release layer is formed in a position to reside as the bottom of the interconnection channel. Preferably, the interconnection channel has a gate adjacent the encapsulant mold cavity. The encapsulant material solidifies and the encapsulant mold is a removed, wherein the gate forms an indentation abutting the cavity. Excess encapsulant solidified in the interconnection channel is leveraged from the surface of the substrate and broken free at the indentation. The remaining release layer may then be removed.

2 Claims, 8 Drawing Sheets

USE OF RESIDUAL ORGANIC COMPOUNDS TO FACILITATE GATE BREAK ON A CARRIER SUBSTRATE FOR A SEMICONDUCTOR DEVICE

CROSS-REFERENCE TO RELATED APPLICATIONS

This application is a divisional of application Ser. No. 09/574,471, filed May 19, 2000, which is a divisional of application Ser. No. 09/019,209, filed Feb. 5, 1998, now U.S. Pat. No. 6,117,708, issued Sep. 12, 2000.

BACKGROUND OF THE INVENTION

1. Field of the Invention

The present invention relates to chip-on-board encapsulation. More particularly, the present invention relates to an encapsulant molding technique used in chip-on-board encapsulation wherein a hydrophobic, residual organic compound layer on the surface of a carrier substrate is used to facilitate removal of unwanted encapsulant material deposited during the molding operation.

2. State of the Art

In the fabrication of semiconductor devices, a common circuit integration technique involves attaching individual semiconductor components, such as semiconductor chips, to a surface of a carrier substrate, such as a printed circuit board (e.g. FR-4), ceramic substrate, BT substrate, cyanate ester substrate, or silicon substrate, by any known chip-on-board attachment technique. Such chip-on-board attachment techniques include, but are not limited to, flip-chip attachment, TAB attachment, and wire bond attachment. After attachment, the semiconductor components may be encapsulated with a viscous liquid or gel insulative material (e.g., silicones, polyimides, epoxies, plastics, and the like) ("encapsulant material") with a transfer molding technique. This encapsulation (depending on its formulation) allows each semiconductor component to better withstand exposure to a wide variety of environmental conditions, such as moisture, ion impingements, heat, and abrasion.

An exemplary transfer molding technique for forming an encapsulant over a semiconductor component is illustrated in FIGS. 11–16. It should be understood that the figures presented in conjunction with this description are not meant to be actual views of any particular portion of an actual semiconducting component or molding device, but are merely idealized representations which are employed to more clearly and fully depict the process of the invention than would otherwise be possible.

FIG. 11 illustrates a pair of semiconductor components 202 attached to a carrier substrate 204 and in electrical communication with the carrier substrate 204 through a plurality of wire bonds 206. As shown in FIGS. 12 and 13, a multi-cavity encapsulant mold 208 is placed over the carrier substrate 204 and semiconductor components 202 (shown in shadow line in the top plan view illustrated in FIG. 12), such that cavities 210 (shown in shadow line in the top plan view illustrated in FIG. 12) of the multi-cavity encapsulant mold 208 are substantially centered over each semiconductor component 202. The multi-cavity encapsulant mold 208 is pressed against the carrier substrate 204 to prevent the border or other portions of the carrier substrate 204 from being covered by encapsulant material to be subsequently injected.

The cavities 210 of the multi-cavity encapsulant mold 208 are usually connected by an interconnection array of channels 212 connected to a central reservoir 214 (see FIG. 12) from which an encapsulant material, such as a molten particle-filled polymer, is fed under pressure. Usually, the channels 212 have constricted regions called "gates" 216 adjacent each cavity 210, as shown in FIG. 13. The gate 216 controls the flow and injection velocity of the encapsulant material 218 into each cavity 210 and forms a break point abutting the cavity 210 to permit removal of the excess channel encapsulant 222 which solidifies in the channels 212, as shown in FIG. 14. After the encapsulation of the semiconductor component 202 is complete and the encapsulant solidified, the multi-cavity encapsulant mold 208 is removed, as shown in FIG. 15. The excess channel encapsulant 222 at locations defined by channels 212 is then leveraged (shown in shadow lines in FIG. 15) from the surface of the carrier substrate 204 and broken free at an indentation 226 formed by the gate 216 (see FIGS. 13 and 14), called "gate break," as shown in FIG. 16.

The adhesion of the solidified encapsulant material 218 to the carrier substrate 204 must be very strong such that the solidified encapsulant material 218 does not detach from carrier substrate 204. However, this strong adhesion is disadvantageous when attempting to remove the excess channel encapsulant 222 from the carrier substrate 204. If the adhesion force between the excess channel encapsulant 222 and the carrier substrate 204 exceeds the cohesive strength of the material of the carrier substrate 204 itself, the carrier substrate 204 will delaminate or rupture when the excess channel encapsulant 222 is leveraged from the surface of the carrier substrate 204.

Various methods have been devised to prevent the excess channel encapsulant from adhering to the carrier substrate. One such method is presented in U.S. Pat. No. 5,542,171 issued Aug. 6, 1996 to Juskey et al. ("the Juskey patent") which relates to treating a predetermined portion of the surface of the carrier substrate over which the mold channels will reside to prevent the excess encapsulant material thereon from adhering to the carrier substrate. The Juskey patent teaches selectively contaminating the surface portion with an ink or a polymer. A drawback of the Juskey patent is that applying inks or polymers to the carrier substrate surface risks contamination of the area adjacent a semiconductor chip, which contamination may prevent the adhesion of the encapsulant material over the semiconductor chip to the carrier substrate, resulting in a compromised package.

Furthermore, the technique taught in the Juskey patent would not be applicable to FR-4 substrates (flame retardant epoxy glass laminate). FR-4 requires a cleaning step, such as plasma cleaning, just before encapsulation to remove unwanted organic compounds in order to obtain sufficiently strong adhesion between the encapsulant material and the FR-4 substrate. Unfortunately, the plasma cleaning would also remove the ink or polymer as taught in the Juskey patent and, as mentioned above, addition of inks or polymers after such cleaning would risk contamination of the area adjacent a semiconductor chip. Thus, for an FR-4 substrate, the predetermined surface portion on the carrier substrate is plated with gold. The gold plating adheres to the FR-4 substrate, but not to most encapsulant materials. Also, this non-adhering property of the gold to encapsulant materials is not affected during the plasma cleaning of the carrier substrate. However, such gold plating is expensive.

An alternative arrangement of channels which injects the encapsulant material from the top (i.e., no excess encapsulant material on the carrier substrate when encapsulating the semiconductor component) has been used, but this requires a more complex and expensive molding system.

Thus, it can be appreciated that it would be advantageous to develop an inexpensive technique to treat a predetermined portion of the surface of the carrier substrate, over which the transfer mold channels will reside to prevent the excess encapsulant material from sticking to the carrier substrate while using commercially-available, widely-practiced semiconductor device transfer-molding packaging techniques.

BRIEF SUMMARY OF THE INVENTION

The present invention relates to an encapsulant molding technique used in chip-on-board encapsulation wherein a hydrophobic, residual organic compound layer on the surface of a carrier substrate is used to facilitate removal of unwanted encapsulant material.

During the fabrication of the carrier substrate or during various chip-on-board attachment processes, such as attaching a semiconductor chip with an adhesive to a carrier substrate, a thin layer of organic compounds forms over a surface of the carrier substrate on which the semiconductor chip is attached. The organic compound layer is generally stripped with a cleaning step, such as plasma cleaning, before encapsulating the semiconductor chip, so that an encapsulant material will adhere to the carrier substrate. However, the present invention utilizes a predetermined portion of the organic compound layer to facilitate gate break.

A mask is applied over the predetermined portion of the organic compound layer. It is, of course, understood that the mask can be any material which is capable of masking the organic compound layer including, but not limited to, a pre-patterned piece of metal or other rigid structure which is held onto the carrier substrate, a pre-patterned tape-type material which attaches to the carrier substrate, or a viscous material applied to the predetermined portion of the organic compound layer by any known means, such as stenciling, spray-on, roll on, screen printed application, and the like. The carrier substrate is then cleaned to remove the organic compound layer. However, the mask protects the masked portion of the organic material layer. The mask may completely resist the cleaning step, wherein the mask would be removed with an appropriate processing step, or the mask may be ablated away during the cleaning step to leave at least a portion of the original portion of the organic material layer which becomes a release layer to facilitate gate break. If a pre-patterned metal or other rigid structure or tape-type material is used as a mask, the mask is simply removed after the cleaning step.

An encapsulant mold is placed over the carrier substrate and semiconductor chip, such that a cavity of the encapsulant mold is substantially centered over the semiconductor chip. An encapsulant material is injected into the encapsulant mold cavity through at least one interconnection channel which is connected to an encapsulant material source. The release layer is formed in a position to reside at the bottom of the interconnection channel. Preferably, the interconnection channel has a gate adjacent the encapsulant mold cavity to control the flow and injection velocity of the encapsulant material into the encapsulant mold cavity.

The encapsulant material solidifies and the encapsulant mold is removed, wherein the gate forms an indentation abutting the cavity. Excess encapsulant solidified in the interconnection channel is leveraged from the surface of the carrier substrate and broken free at the indentation. Optionally, the remaining release layer may then be removed.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

FIGS. 1–10 illustrate a method of utilizing a residual organic compound layer on the surface of a carrier substrate which is used to facilitate removal of unwanted encapsulant material deposited on said carrier substrate during the molding operation according to one embodiment of the present invention. It should be understood that the figures presented in conjunction with this description are not meant to be actual views of any particular portion of an actual semiconductor component or molding device, but are merely idealized representations which are employed to more clearly and fully depict the process of the invention than would otherwise be possible.

Figure 1:
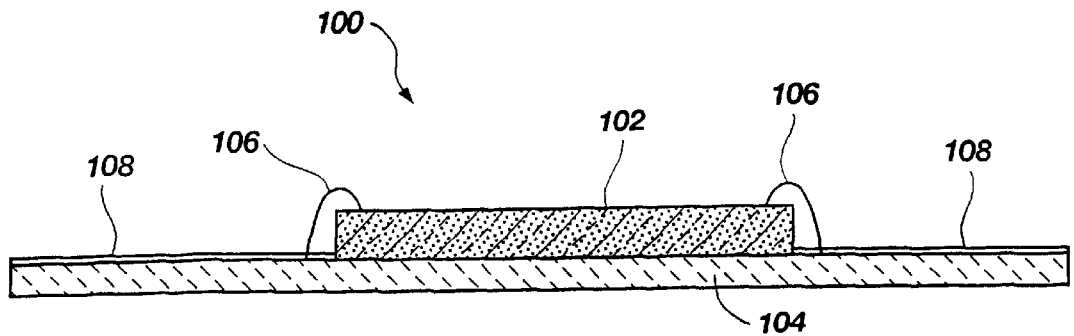
FIG. 1 is a cross-sectional view of a chip-on-board assembly having an organic compound layer therein.

During the fabrication of the carrier substrate or during various chip-on-board attachment processes, such as attaching a semiconductor chip with an adhesive to a carrier substrate, a thin layer of organic compounds forms over a surface of the carrier substrate on which the semiconductor chip is attached. FIG. 1 illustrates an exemplary chip-on-board assembly 100 comprising a semiconductor chip 102 attached to a carrier substrate 104, such as a printed circuit board (e.g., FR-4), ceramic or silicon substrate, wherein electrical contact, such as between pads on said semiconductor chip 102 and traces on the surface of the carrier substrate 104, is made with wire bonds 106. It is, of course, understood that the semiconductor chip 102 could be in electrical communication with the carrier substrate 104 by other techniques, such as TAB or flip-chip attachment.

As discussed above, a thin layer of organic compounds 108 is present on the carrier substrate 104. The organic compound layer 108 is generally stripped with a cleaning step, such as plasma cleaning, before encapsulating the semiconductor chip 102, so that an encapsulant material will adhere to the carrier substrate 104. However, it has been found that a portion of the organic compound layer 108 may be shielded from this stripping and used as a release layer.

Figure 2:
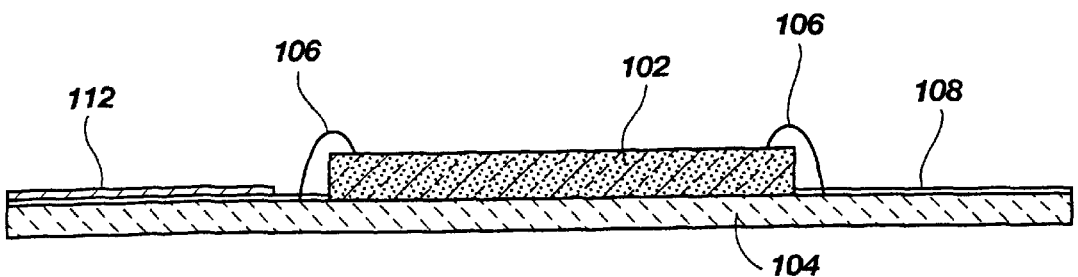
FIG. 2 is a cross-sectional view of the chip-on-board assembly having a mask patterned on the organic compound layer.
Figure 3:
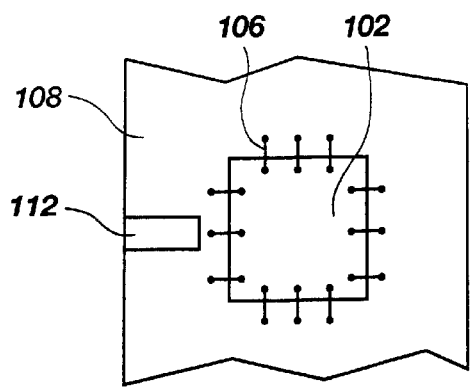
FIG. 3 is a top plan view of FIG. 2.

FIGS. 2–3 illustrate a side cross-sectional view and a top plan view, respectively, of a mask 112 applied over a specific portion of the organic compound layer 108. It is, of course, understood that the mask 112 can be any material which is capable of masking the organic compound layer 108 including, but not limited to, a pre-patterned piece of metal or other rigid structure which is held onto the carrier substrate 104, a pre-patterned tape-type material which attaches to the carrier substrate 104, or a viscous material applied to the predetermined portion of the organic compound layer 108 by any known means, such as stenciling, spray-on, roll on, screen printed application, and the like.

Figure 4:
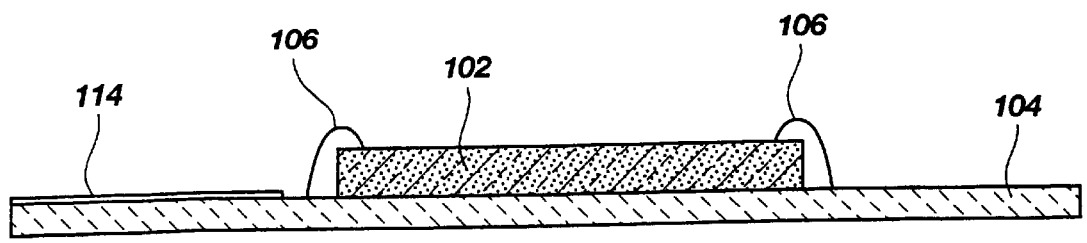
FIG. 4 is a side cross-sectional view of the chip-on-board assembly after cleaning.

After the application of the mask 112, the carrier substrate 104 is then cleaned to remove the organic compound layer 108. However, the mask 112 protects the masked portion of the organic compound layer 108. The mask 112 may completely resist the cleaning step, wherein the mask 112 would be removed with an appropriate processing step, or the mask 112 may be ablated away during the cleaning step to leave at least a portion of the original portion of the organic compound layer 108, which becomes a release layer 114, as shown in FIG. 4. If the mask 112 is a pre-patterned piece of rigid material or tape-type material, the mask 112 is simply removed from the carrier substrate 104 after the cleaning step.

Figure 5:
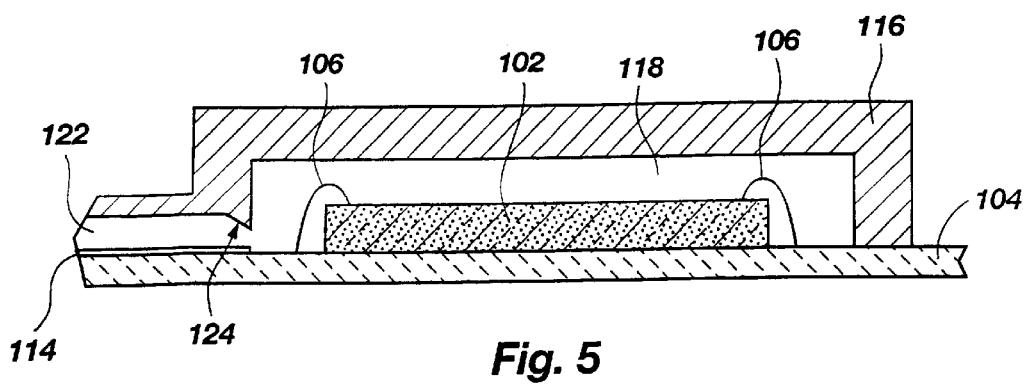
FIG. 5 is a side cross-sectional view of an encapsulant mold covering a semiconductor chip on the chip-on-board assembly.

As shown in FIG. 5, an encapsulant mold 116 is placed over the carrier substrate 104 and semiconductor chip 102, such that a cavity 118 of the encapsulant mold 116 is substantially centered over the semiconductor chip 102. The encapsulant mold 116 is pressed against the carrier substrate 104 to prevent the border of the carrier substrate 104 from being covered by encapsulant material to be subsequently injected.

The encapsulant mold cavity 118 is connected to an encapsulant material source (not shown) by an interconnection channel 122. The release layer 114 is formed in a position to reside as the bottom of the interconnection channel 122, as shown in FIG. 5. Preferably, the interconnection channel 122 has a constriction or gate 124 adjacent the encapsulant mold cavity 118 to control the flow and injection velocity of encapsulant material into the encapsulant mold cavity 118.

Figure 6:
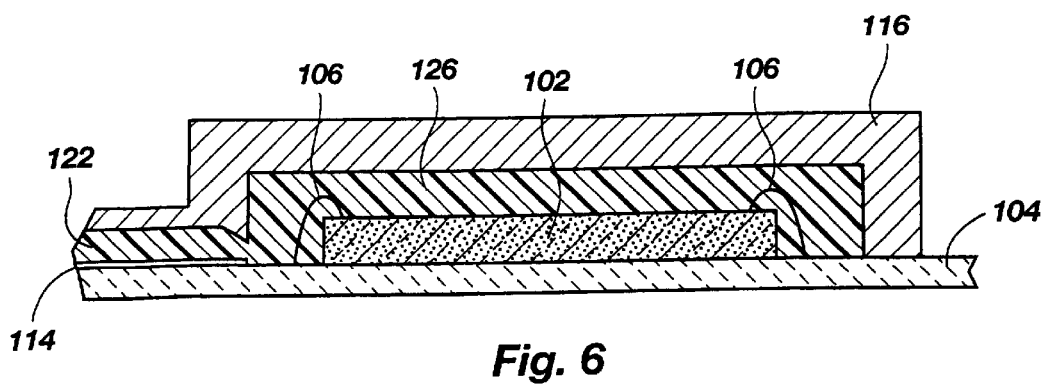
FIG. 6 is a side cross-sectional view of the encapsulant mold filled with encapsulant material.
Figure 7:
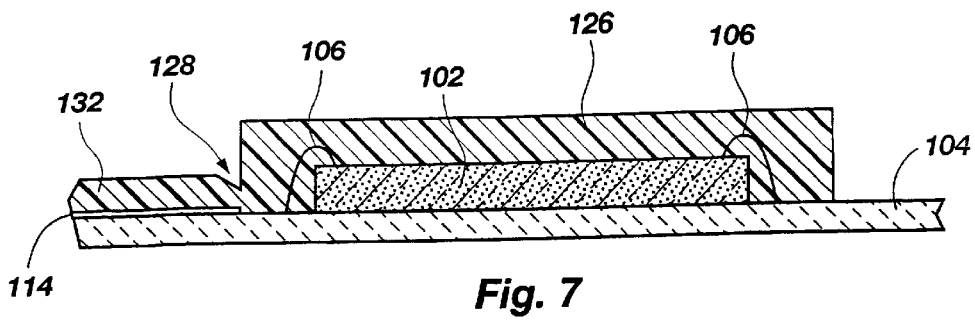
FIG. 7 is a side cross-sectional view of an encapsulated semiconductor chip prior to the removal of excess channel encapsulant.
Figure 8:
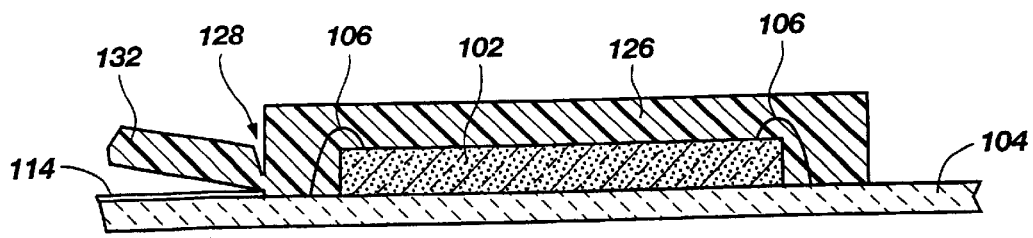
FIG. 8 is a side cross-sectional view of an encapsulated semiconductor chip with the excess channel encapsulant leveraged from the carrier substrate.
Figure 9:
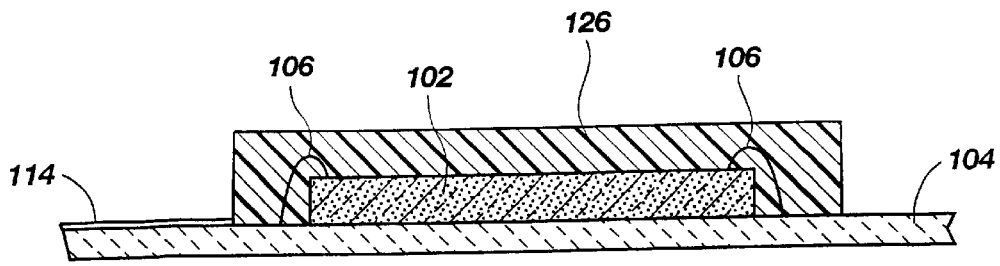
FIG. 9 is a side cross-sectional view of an encapsulated semiconductor chip after. the removal of excess channel encapsulant.
Figure 10:
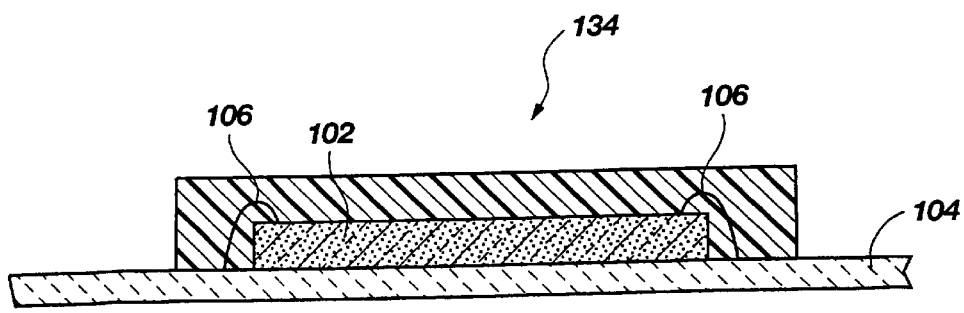
FIG. 10 is a side cross-sectional view of an encapsulated semiconductor chip after removal of the release layer.
Figure 11:
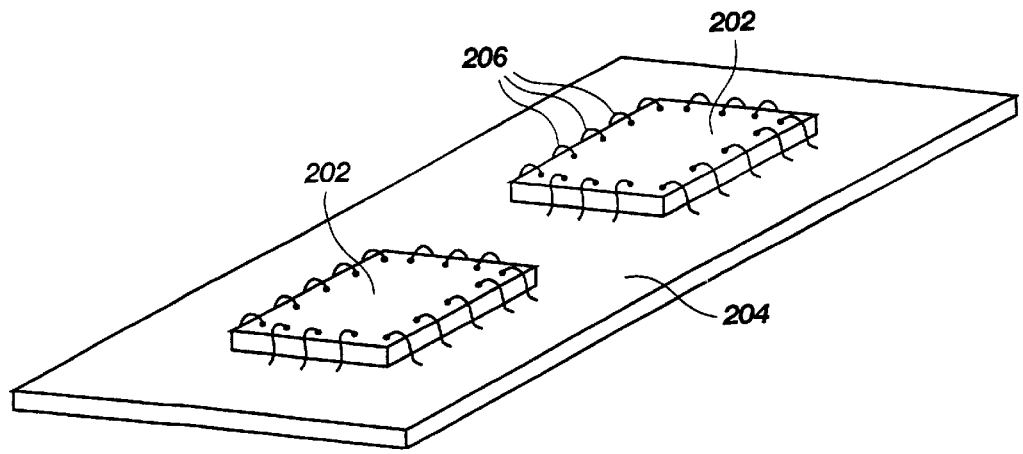
FIG. 11 is an oblique view of a pair of semiconductor components electrically connected to a carrier substrate by wire bonds.
Figure 12:
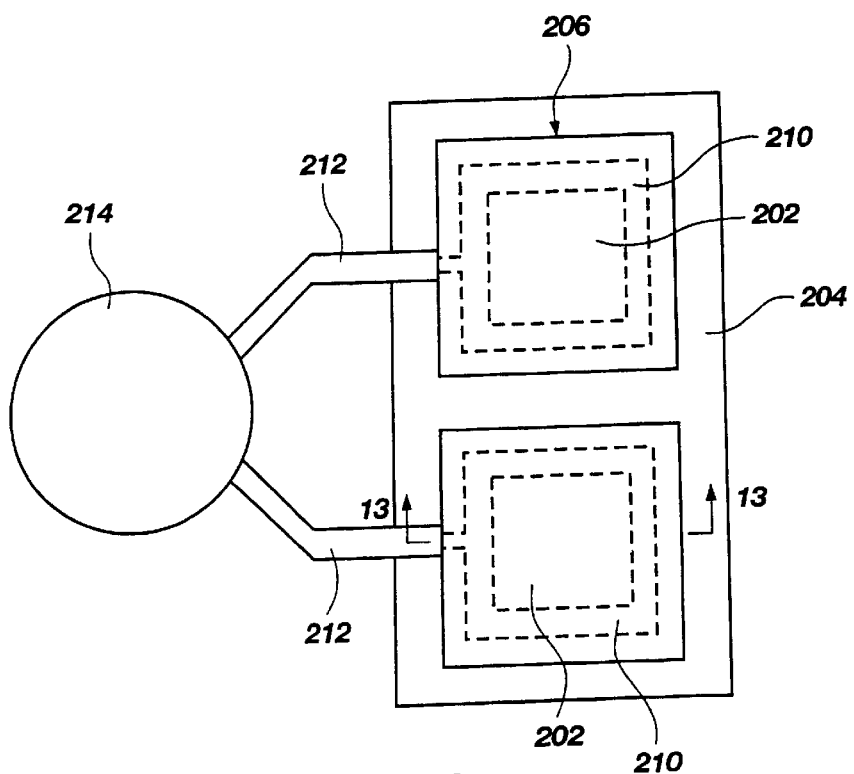
FIG. 12 is a top plan view of an encapsulant mold covering semiconductor components according to a known technique.
Figure 13:
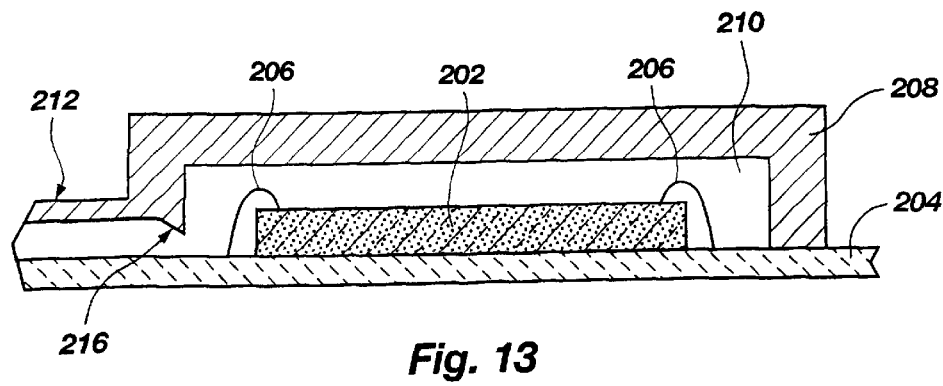
FIG. 13 is a side cross-sectional view of an encapsulant mold covering a semiconductor component according to a known technique.
Figure 14:
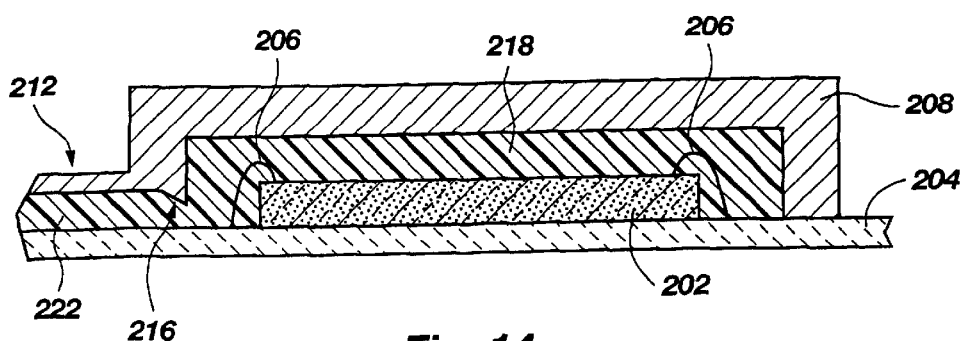
FIG. 14 is a side cross-sectional view of an encapsulant filled mold according to a known technique.
Figure 15:
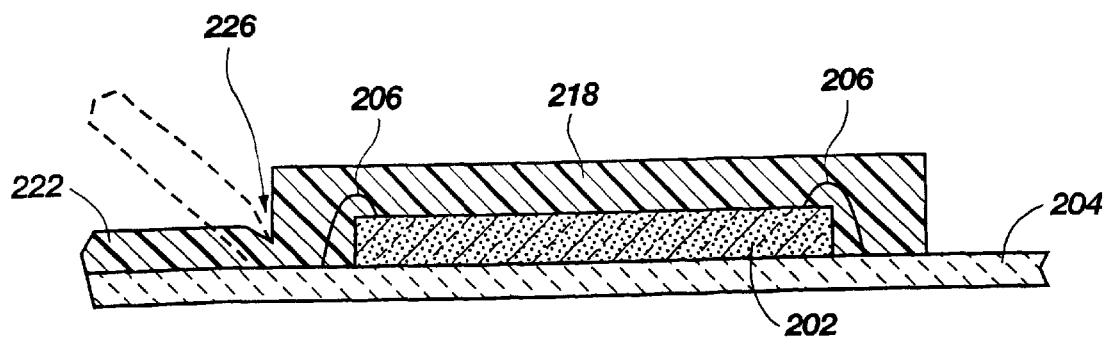
FIG. 15 is a side cross-sectional view of an encapsulated semiconductor component prior to the removal of excess channel encapsulant according to a known technique.
Figure 16:
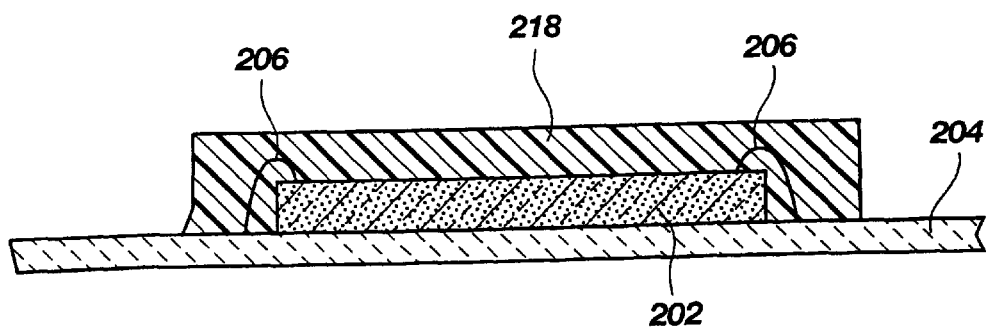
FIG. 16 is a side cross-sectional view of an encapsulated semiconductor component after removal of excess channel encapsulant according to a known technique.

As shown in FIG. 6, a molten encapsulant material 126 is injected under pressure into the encapsulant mold cavity 118 through the interconnection channel 122 to fill the encapsulant mold cavity 118. The encapsulant material 126 in the encapsulant mold cavity 118 and the interconnection channel 122 cools and solidifies and the encapsulant mold 116 is removed, as shown in FIG. 7. The gate 124 (see FIG. 5) forms an indentation 128 abutting the encapsulant mold cavity 118. Excess encapsulant 132 solidified in the interconnection channel 122 is leveraged from the surface of the carrier substrate 104, as shown in FIG. 8, and broken free at the indentation 128, as shown in FIG. 9. Optionally, the remaining release layer 114 may be removed to form the encapsulated structure 134, as shown in FIG. 10.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. An encapsulation system that facilitates removal of unwanted encapsulation material when encapsulating a semiconductor device to be attached to a carrier substrate, the system comprising:

an encapsulant material source;

a mold attachable to the carrier substrate to substantially enclose the semiconductor device; and an interconnection channel interconnecting the encapsulant material source and the mold, the interconnection channel positionable over at least a portion of an organic material-containing residual path, the path extending from at least one semiconductor device attachment location to a periphery of said carrier substrate.

2. The system of claim 1, wherein said organic material-containing residual path facilitates removal of the encapsulant material thereon.

* * * * *

UNITED STATES PATENT AND TRADEMARK OFFICE
CERTIFICATE OF CORRECTION

PATENT NO.    : 6,524,960 B2
DATED         : February 25, 2003
INVENTOR(S)   : Richard W. Wensel It is certified that error appears in the above-identified patent and that said Letters Patent is hereby corrected as shown below:

<u>Column 4,</u>
Line 15, change the comma after "assembly" to a semicolon
Line 25, delete the period after "after"

Signed and Sealed this

Twenty-third Day of March, 2004

JON W. DUDAS
*Acting Director of the United States Patent and Trademark Office*